United States Patent
Hui et al.

(10) Patent No.: US 6,893,883 B2
(45) Date of Patent: May 17, 2005

(54) METHOD AND APPARATUS USING AN ON-CHIP RING OSCILLATOR FOR CHIP IDENTIFICATION

(75) Inventors: Frank Yauchee Hui, Orlando, FL (US); Robert Y S Huang, Ocoee, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/643,123

(22) Filed: Aug. 18, 2003

(65) Prior Publication Data

US 2005/0040397 A1 Feb. 24, 2005

(51) Int. Cl.$^7$ ............................................... H01L 21/66
(52) U.S. Cl. ............................ 438/14; 438/17; 438/18
(58) Field of Search ............................. 438/10, 17, 11, 438/14, 18, 15; 257/48, 620, 665, 700; 716/4

(56) References Cited

U.S. PATENT DOCUMENTS

| | | | |
|---|---|---|---|
| 5,266,890 A | 11/1993 | Kumbasar et al. | |
| 5,486,786 A | 1/1996 | Lee | |
| 5,686,855 A | 11/1997 | Lee | |
| 6,463,570 B1 | * 10/2002 | Dunn et al. | |
| 6,664,799 B2 | * 12/2003 | Lovett | |

* cited by examiner

*Primary Examiner*—Nathan J. Flynn
*Assistant Examiner*—Kevin Quinto

(57) ABSTRACT

An apparatus and method for identifying integrated circuit chips or dice on a semiconductor wafer. Each chip comprises a ring oscillator having a characteristic oscillating frequency different from the oscillating frequency of the ring oscillators of other chips on the same wafer. Each chip can be associated with various attributes of the wafer on which it was formed and the process steps to which it was subjected using the ring oscillator frequency.

9 Claims, 3 Drawing Sheets

METHOD AND APPARATUS USING AN ON-CHIP RING OSCILLATOR FOR CHIP IDENTIFICATION

FIELD OF THE INVENTION

This invention relates generally to semiconductor integrated circuit fabrication technologies and more specifically to the identification of individual die on a semiconductor wafer.

BACKGROUND OF THE INVENTION

During the semiconductor fabrication process, a semiconductor wafer undergoes multiple processing steps, such as layering, patterning, etching, doping and heat treating, to form a plurality of substantially identical independent chips or dice, each comprising semiconductor devices and interconnect structures. After fabrication the wafer is cut along scribe lines between adjacent dice. The singulated dice or chips are tested and packaged for use in electronic devices.

Unwanted defects introduced during the fabrication process may cause a chip or a plurality of chips to be rendered non-functional. For example, if a dust speck particle falls upon the surface of the wafer, the particle forms a hard mask and prevents exposure of the underlying regions to subsequent processing steps. These defects typically result in an inoperative die and will be detected during the testing phase. More subtle defects are not detectable during testing but can result in premature failure of the integrated circuit during operation. Such failures can be caused by operator error or a process tool that is operating outside of its specifications.

While defect particles are to be avoided, the effect is typically limited to one die or a small number of adjacent dice. By comparison, operator error and process tool problems generally affect all dice on the wafer. Since the wafers are processed in batches, where a batch size ranges from a single wafer to 25 wafers, all wafers in the batch can be similarly affected.

In an effort to determine the cause of defects and premature device failures, it is considered advantageous to track the wafer through the manufacturing process and develop a record of the processing steps to which the wafer was subjected. Thus each wafer includes a unique identification such as a bar code or other identifying indicia printed or laser engraved on the wafer surface. Bar codes comprise a number of spaced apart parallel lines of varying widths, with data encoded in the line width and the line spacing. As the wafer is processed through fabrication tools, an optical probe scans the wafer with an incident light beam in a direction normal to the bar code lines. The incident beam is modulated by the bar code lines to produce a reflected beam that caries a unique signature of the scanned bar code. The reflected light beam is directed to and detected by an electro-optical detector to form an electronic signal representing the scanned bar code. The code is associated with the wafer and thus serves to track the wafer during the fabrication process steps. In lieu of bar codes, it is also known to use laser inscribed dots for wafer identification.

FIG. 1 illustrates a wafer 10 on which are formed a plurality of dice 12. Although for convenience only four such dice 12 are illustrated in FIG. 1, it is known by those skilled in the art that a considerably greater number of circuit dice (typically between about 100 and 1000) are conventionally formed in the wafer 10. Disposed in one corner of each dice 12 is an identification element 16, such as a bar code or laser inscribed dots as discussed above.

It may also be desired to track individual wafer dice by associating each die with a source wafer, a manufacturing lot, a wafer history and/or a die site identifier (i.e., representing the location of the die on the wafer). If the die fails during testing or in the field, the location information can be useful to track defects or yield problems in a wafer region or to identify the source wafer and wafer lot, and thus the processes to which the wafer was subjected during fabrication. In such cases, it may then be appropriate to advise purchasers of the integrated circuits from the suspected lot that in-field failures are possible based on the failure of one or more dice processed in the same lot.

Although identifying information can be physically added to each die by a bar code or laser inscribed dots as described above, this may be avoided due to the extra processing costs incurred. Another known technique for identifying individual chips or dice on a wafer comprises the use of a one-time programmable device such as a laser fuse. A plurality of such fuses are formed on the die and certain ones of the plurality are opened with a laser beam to form a binary pattern of opened and closed fuses. The combination of opened and closed fuses represents a die signature, which is read by passing current through the assembly of fuses. A sense amplifier receives the output current to detect the logic state of each fuse (a zero for an unblown or closed fuse and a 1 for a blown or open fuse, or vice versa). Disadvantageously, the formation of laser fuses (and bar codes) requires the creation of a process mask and execution of additional process steps to form the fuses or bar codes. Also, these indicia consume chip area that could otherwise be devoted to active devices.

In those instances where individual die are identified according to one of the techniques described above, the die identification information is lost after the chip is packaged, unless the package is also marked. To limit costs, packages are typically marked with only wafer lot identifiers and not with die identifiers. Since a wafer lot comprises a substantial number of dice the lot information can be cost-effectively applied, by silk screening, for example, to all packages containing dice from the same lot. Thus die identification information can be determined only by removing the chip from its package.

BRIEF SUMMARY OF THE INVENTION

The present invention describes a method for identifying an integrated circuit device have a frequency marker device formed thereon. The method comprises applying power to the frequency marker device and determining the frequency of the frequency marker device. The frequency is associated with the integrated circuit device.

The present invention further describes an integrated circuit die comprising a frequency identifier that can be determined to correlate the die with the location in a manufacturing wafer lot.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

Figure 1:
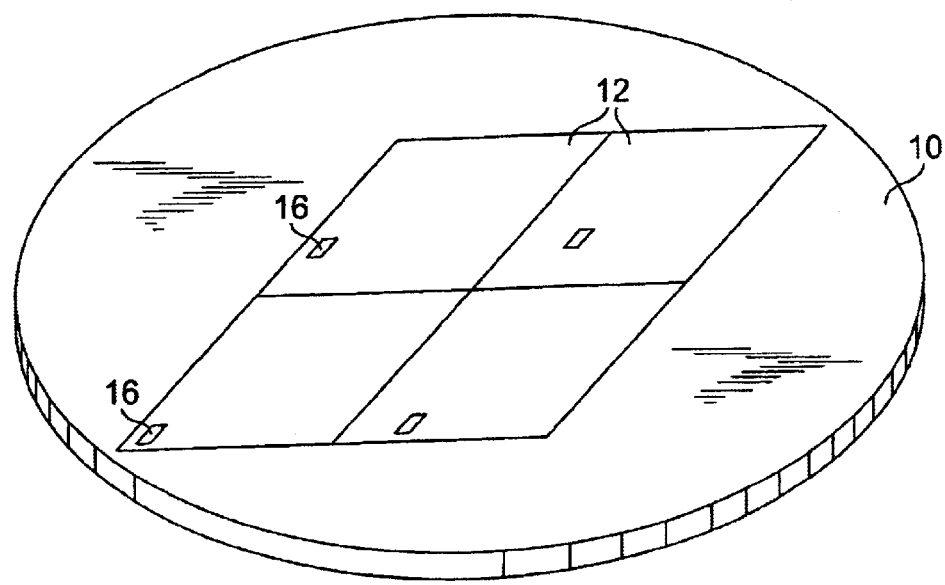
FIG. 1 is a prior art wafer comprising a plurality of dice to which the teachings of the present invention can be applied.

Before describing in detail the particular method and apparatus for identifying individual dice or chips on a wafer, it should be observed that the present invention resides primarily in a novel and non-obvious combination of elements and process steps. Accordingly, the inventive elements have been represented by conventional elements in the drawings, showing only those specific details that are pertinent to the present invention so as not to obscure the disclosure with details that will be readily apparent to those skilled in the art having the benefit of the description herein.

Most semiconductor chips, such as dynamic random access memories and digital integrated circuits include an oscillator circuit or other frequency marker or identifier circuit. The oscillator circuit generates clock signals for timing synchronous and/or asynchronous events, for memory refresh operations in a random access memory and for driving voltage pumps.

Figure 2:
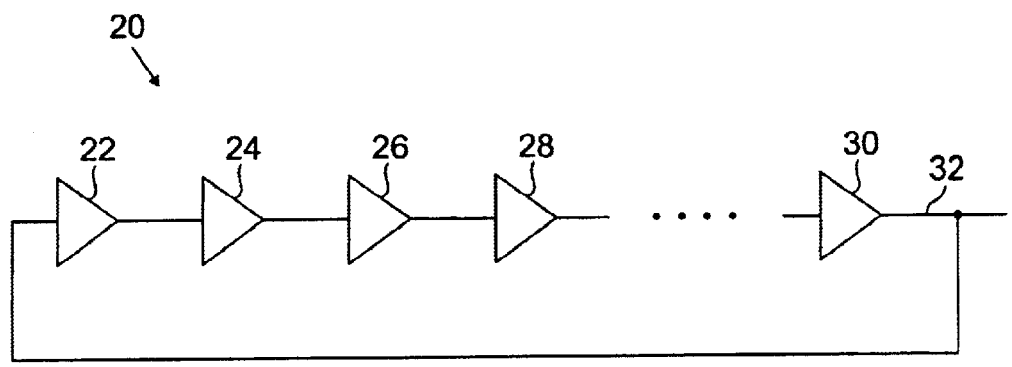
FIG. 2 is an exemplary ring oscillator for use according to the teachings of the present invention.

One such oscillator circuit commonly fabricated on integrated chips is known as a "ring oscillator." The ring oscillator comprises an odd number of inverting devices, such as conventional logic inverters, connected in series with a feedback loop from the output to the input terminal. FIG. 2 illustrates an exemplary ring oscillator 20, comprising binary logic inserters 22, 24, 26, 28 and 30. Those skilled in the art recognize that an odd number of inverters with feedback renders the ring oscillator 20 inherently unstable. Oscillatory action is produced when an output signal at a first logic level is fed back to an input terminal at a second logic level. The output transitions to the second logic level and the process continuously repeats.

The ring oscillator frequency of oscillation is inversely proportional to the time required for a logic signal transition to propagate from the first inverter 22 to an output terminal 32 of the last inverter 30. Since each of the inverters 22, 24, 26, 28 and 30 has a propagation delay time characteristic, the clock frequency is nominally inversely proportional to the number of inverters comprising the ring oscillator 20. The propagation delay of each inverter, and hence the oscillation frequency, is a function of variables such as the process technology employed to fabricate the ring oscillator 20, fabrication tolerances associated with the various process steps and a supply voltage (not shown) applied to each of the inverters 22, 24, 26, 28 and 30.

The aforementioned process variables cause the ring oscillator on each die to have a different characteristic frequency (i.e., the natural oscillation frequency of the ring oscillator) than the characteristic frequency of other ring oscillators on the same wafer. In particular, it has been found that the ring oscillator characteristic frequency is sensitive to the gate length (also referred to as the gate polysilicon critical dimension) of the metal-oxide field effect transistors (MOSFETS) that comprise the logic elements or inverters of the ring oscillator. In particular, the characteristic frequency has a sensitivity of about 0.2 nanometers/MHz, whereas the process margin for forming the gate is typically about +/− 10 nanometers. Thus while the process for forming the gate remains within the prescribed tolerance, the characteristic frequency can vary between chips on the same wafer. It has also been found that the process of forming metal interconnects on the chip causes variations in the oscillator characteristic frequency, but these effects tend to be less pronounced than the gate length effects.

Thus, each wafer die is identifiable by the characteristic frequency of the ring oscillator 20 fabricated thereon. A wafer 40 according to the teachings of the present invention is illustrated in FIG. 3A, as comprising a plurality of dice 42, each comprising a ring oscillator. One such die 42 is illustrated in the close-up view of FIG. 3B, where the ring oscillator is identified by a reference character 44.

According to the teachings of the present invention, the ring oscillator frequency is determined prior to singulating the wafer into individual dice, and the frequency is associated with one or more unique identifying characteristics of the die or attributes of the wafer on which the die was formed. For example, the ring oscillator can be associated with the wafer number, series number, fabrication process dates, password, wafer lot and/or X-Y Cartesian coordinate location of the die on the source wafer. See FIG. 3B where one of the dice 42 is identified by location coordinates (Xi, Yi). Also, chip operation can be tracked through its operational life to determine the effect of process changes implemented during the fabrication process. Chip failure analysis can be tied back to a wafer lot and wafer location in an effort to determine the root cause of the failure. Use of the oscillator characteristic frequency as an identifier can avoid the need for including the wafer lot on the die package.

Since the ring oscillation frequency can be measured after completion of the fabrication process, the chip can always be identified with the wafer from which it was taken and the process parameters to which it was subjected. The frequency can be measured either through dedicated package pins connected directly to the ring oscillator or the oscillator can be accessed through multiplexed pins by proper configuration of internal chip switches. Thus it is generally not necessary to remove the chip from its package to determine the characteristic frequency.

Typically the ring oscillator will begin to oscillate in response to an applied bias supply voltage as each inverter naturally assumes a one or a zero state and the feedback loop creates an inherent instability for the ring oscillator. Otherwise external perturbations known in the art can be employed to induce oscillations.

A simple look-up table with the characteristic frequency serving as a tabular index can associate the chip with its wafer attributes (e.g., location, wafer lot, source wafer and the fabrication processes employed to fabricate the chip).

Advantageously, no additional mask or process steps are required to implement the teachings of the present invention. Since integrated circuit fabrication processing is a complex and capital-intensive operation, additional mask and process steps are to be avoided whenever possible to limit costs and reduce defect probabilities. Also, a ring oscillator of the present invention does not require software programming or extra process steps to create a unique chip identifier.

Although the chip identification technique of the present invention has been described as utilizing a ring oscillator, other oscillating devices, such as a differential ring oscillator, can be used in lieu thereof to provide chip identification.

Figure 3:
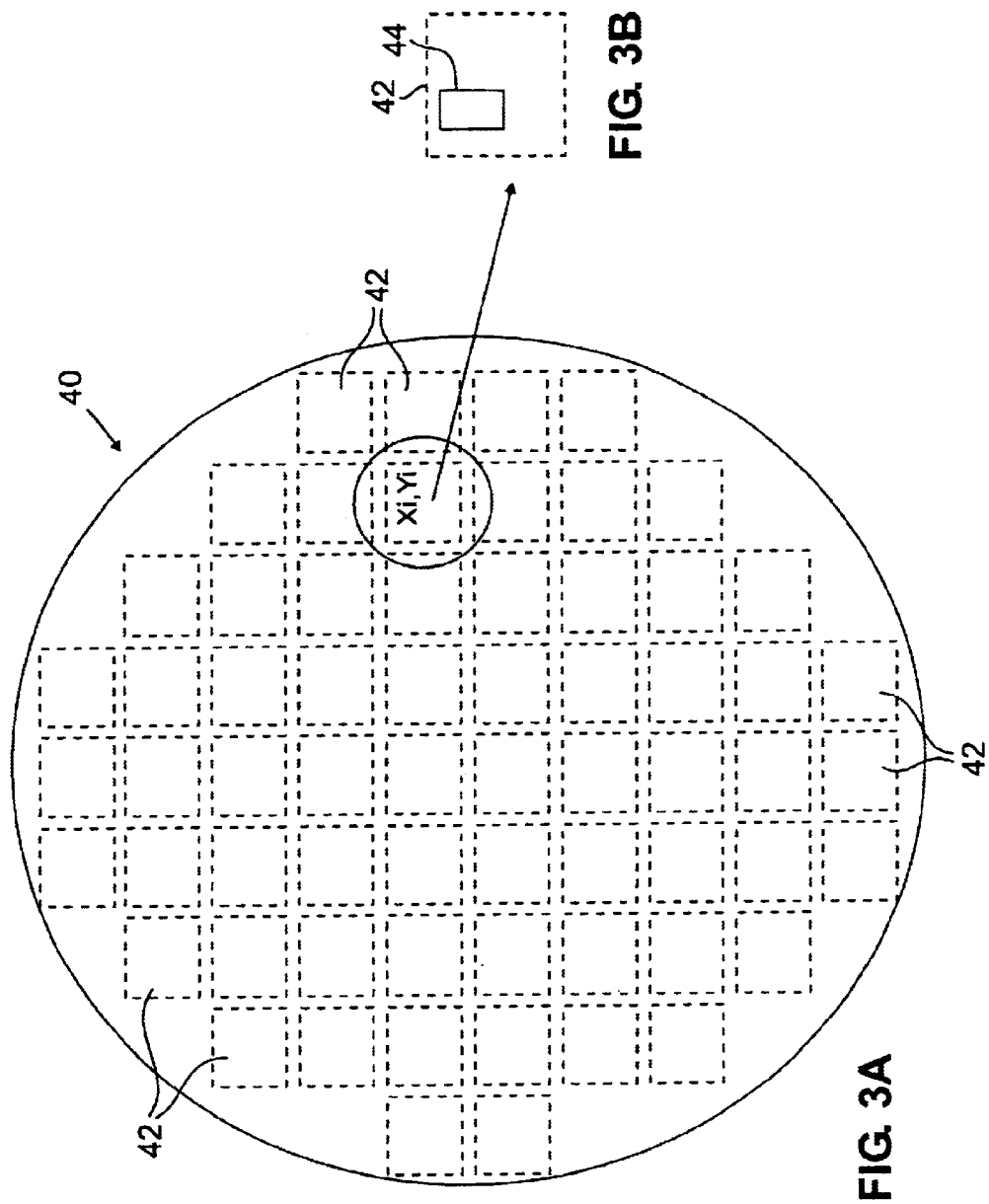
FIGS. 3A and 3B illustrate a wafer comprising a plurality of dice to which the teachings of the present invention can be applied.

FIG. 3 illustrates a flow chart using the ring oscillator characteristic frequency for semiconductor integrated circuit device (or chip) identification. At a step 60, the characteristic frequency (i.e., the oscillating frequency) for the ring oscillator on each die of a wafer is determined. At a step 62 the characteristic frequency is associated with one or more wafer and/or process attributes. For example, the characteristic frequency is associated with the location of the die on the wafer. Alternatively or additionally, the characteristic frequency is associated with one or more process steps for fabricating the wafer. At a step 64, the results of the association process from the step 62 are stored, in a computerized database, for example, for later use.

For example, if a new fabrication process step is introduced, the fabricating plant operator may desire to follow the field experience of integrated circuits manufactured according to the new process step. Advantageously, the ring oscillator characteristic frequency can be used to accomplish this objective. For all wafers subjected to the new process step, the oscillating frequency of each die on each wafer is measured prior to singulating the wafer dice. The frequency is associated with the new process step. Thereafter, the characteristic frequency of returned integrated circuits is measured to determine if any were fabricated according to the new process step. With the benefit of this information, failure analysis can be conducted to determine if the new process step contributed to the device failure.

Figure 4:
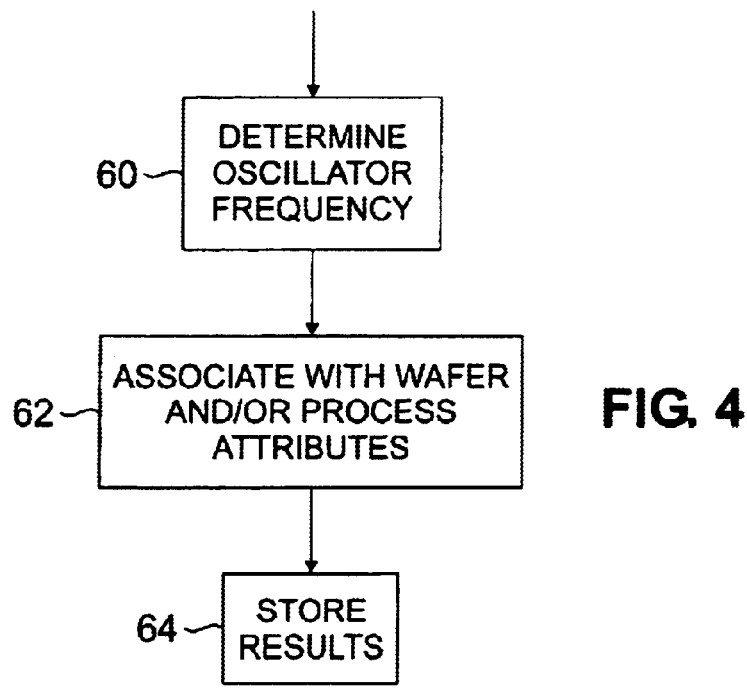
FIGS. 4 and 5 are process flowcharts according to the teachings of the present invention.
Figure 5:
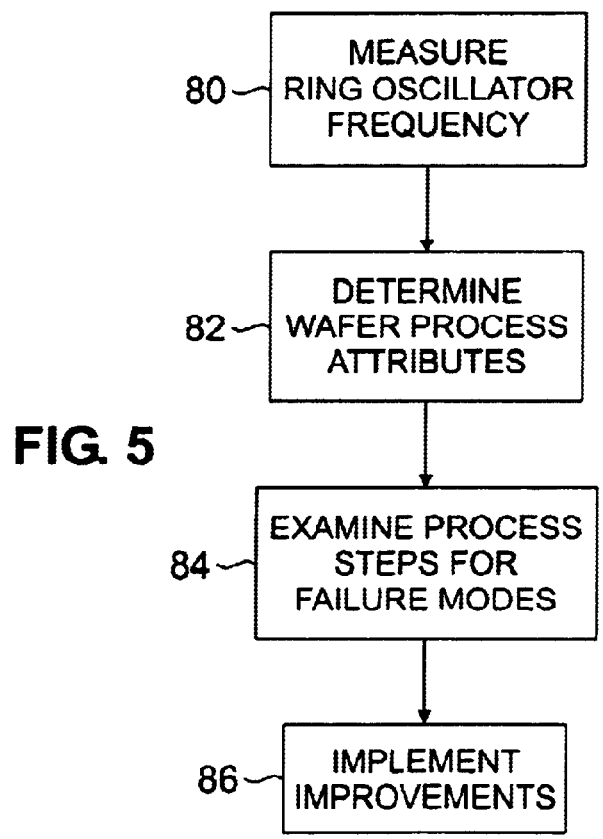

FIG. 4 illustrates a process for implementing process improvements based on integrated circuit failure analysis. At a step 80, the characteristic frequency of a failed integrated circuit is measured. Using the stored results from the step 64 of FIG. 3, at a step 82, the wafer and/or process attributes associated with the measured chip ring oscillator characteristic frequency are determined. At a step 84, the process steps and other attributes can be examined for failure indications. Finally, at a step 86, process improvements are implemented to correct the failures identified at the step 84.

A process has been described as useful for identifying a chip prior to singulating the wafer into individual chips. While specific applications and examples of the invention has been illustrated and discussed, the principles disclosed herein provide a basis for practicing the invention in a variety of ways in any variety of structures. Numerous variations are possible within the scope of the invention. The invention is limited only by the claims that follow.

What is claimed is:

1. A method for identifying an integrated circuit device having a frequency marker device formed thereon, comprising:
    applying power to the frequency marker device;
    determining an oscillating frequency of the frequency marker device; and
    associating the oscillating frequency with the integrated circuit device, wherein the integrated circuit device can be later identified by determining the oscillating frequency.

2. A method for identifying an integrated circuit device having a frequency marker device formed thereon, wherein the integrated circuit device is formed during a plurality of processing steps, comprising:
    applying power to the frequency marker device;
    determining an oscillating the frequency of the frequency marker device; and
    associating the oscillating frequency with the integrated circuit device to identify the integrated circuit device according to the determined oscillating frequency, and associating the frequency with the plurality of processing steps.

3. The method of claim 2 wherein the integrated circuit device is one of a plurality of integrated circuit devices formed on a semiconductor wafer, and wherein the step of associating further comprises associating the frequency with a location of the integrated circuit device on the semiconductor wafer.

4. The method of claim 2 wherein the integrated circuit device is one of a plurality of integrated circuit devices formed on a semiconductor wafer each one of the plurality of integrated circuit devices comprising a ring oscillator, and wherein the method further comprises determining an oscillating frequency of the ring oscillator of each one of the plurality of integrated circuit devices, and wherein the step of associating further comprises associating the oscillating frequency of the ring oscillator of each one of the plurality of integrated circuits devices with a location of the integrated circuit device on the semiconductor wafer.

5. The method of claim 2 wherein the frequency marker device comprises an odd-numbered plurality of serially connected inverter elements and a feedback loop.

6. The method of claim 5 wherein each one of the plurality of inverter elements comprises a binary logic inverter.

7. A method for manufacturing semiconductor devices, comprising:
    (a) providing a semiconductor wafer;
    (b) performing semiconductor fabrication processes on the semiconductor wafer;
    (c) forming semiconductor dice thereon in response to the fabrication processes, wherein the semiconductor dice comprise semiconductor devices, and wherein certain of the semiconductor dice comprise a frequency marker device;
    (d) applying power to the frequency marker device of a one of the semiconductor dice;
    (e) determining the oscillating frequency of the frequency marker device of the step (d);
    (f) associating the oscillating frequency with the one of the semiconductor dice and associating the oscillating frequency with the semiconductor fabrication processes of the step (b)
    (g) repeating the steps (d) through (f) for each one of the semiconductor dice comprising a frequency marker device;
    (h) cutting the semiconductor wafer into individual semiconductor dice; and
    (i) maintaining the association of the step (f) after the semiconductor dice are cut to identify the integrated circuit device according to the determined oscillating frequency.

8. The method of claim 7 wherein the step (f) further comprises associating the oscillating frequency with the location of the semiconductor dice on the wafer.

9. A method for identifying an integrated circuit device having a frequency marker device formed thereon, comprising:
    applying power to the frequency marker device;
    determining an oscillating frequency of the frequency marker device; and
    associating the oscillating frequency with the integrated circuit device to identify a failed integrated circuit device according to the determined oscillating frequency.

* * * * *